United States Patent [19]

Matsuno

[11] Patent Number: 5,654,674
[45] Date of Patent: Aug. 5, 1997

[54] OSCILLATOR CONTROL CIRCUIT WITH PHASE DETECTION FEEDBACK

[75] Inventor: Koichi Matsuno, Kanagawa, Japan

[73] Assignee: Sony Corporation, Tokyo, Japan

[21] Appl. No.: 582,863

[22] Filed: Jan. 4, 1996

[30] Foreign Application Priority Data

Jan. 13, 1995 [JP] Japan ................................. 7-004309

[51] Int. Cl.$^6$ .................................................. H03L 7/085
[52] U.S. Cl. .......................... 331/1 R; 331/1 A; 331/27; 375/376; 455/263; 455/265; 455/318
[58] Field of Search .................................. 331/1 R, 1 A, 331/25, 27; 455/208, 209, 263, 264, 265, 318; 375/344, 373, 376

[56] References Cited

U.S. PATENT DOCUMENTS 4,255,759  3/1981  Ohmori et al. ........................... 348/505
4,672,636  6/1987  Marshall et al. ........................ 329/325

*Primary Examiner*—Siegfried H. Grimm
*Attorney, Agent, or Firm*—Jay H. Maioli

[57] ABSTRACT

A controllable crystal oscillator of a receiver having a mixer producing an IF signal is controlled by a feedback loop that includes a phase detector. The IF signal is delayed by an odd multiple of $\pi/2$ and fed to one input of an exclusive-OR circuit, with the other input receiving the IF signal directly. The phase detection signal from the exclusive-OR circuit can be counted and converted to an analog voltage when the oscillator is a voltage controlled oscillator or it can be counted and used as a digital control signal when the oscillator is a data controlled oscillator.

6 Claims, 7 Drawing Sheets

FIG. 3A  Received Wave
FIG. 3B  Delayed Signal
FIG. 3C  Output of Exclusive-or Gate fc: Accurate Second Intermediate Frequency

OSCILLATOR CONTROL CIRCUIT WITH PHASE DETECTION FEEDBACK

BACKGROUND OF THE INVENTION

The present invention relates to a receiving circuit or a receiver for receiving an RF signal and more particularly to a manner in which an oscillator for oscillating a reference signal used to determine a receiving frequency is controlled.

FIG. 1 of the accompanying drawings shows an example of a receiving circuit.

As shown in FIG. 1, an RF signal received at an antenna 1 is supplied to a first mixer 2. The first mixer 2 mixes the RF signal with a frequency signal for selecting a receiving frequency output from a first phase-locked loop (PLL) circuit 6 to convert the reception signal of a predetermined frequency to a first intermediate frequency signal. For example, a reception signal of 900 MHz band is converted into a first intermediate frequency signal of 50 MHz band.

The first intermediate frequency signal is supplied to a second mixer 3 which mixes the first intermediate frequency signal with a frequency signal for frequency conversion output from a second PLL circuit 7 to convert the first intermediate frequency signal into a second intermediate frequency signal different from the first intermediate frequency signal. For example, the first intermediate frequency signal of 50 MHz band is converted into a second intermediate frequency signal of 50 kHz band.

The second intermediate frequency signal is supplied to a demodulator 4, in which it is demodulated according to a predetermined demodulation system. A demodulated baseband signal is developed at a baseband signal output terminal 5.

The first and second PLL circuits 6 and 7 for obtaining the first and second intermediate frequency signals generate the first and second intermediate frequency signals of predetermined frequencies based on the reference frequency signal of a voltage-controlled type temperature compensated crystal oscillator (TCXO) 8.

The accuracy of each of the output frequencies of the first and second PLL circuits 6, 7 depends upon the accuracy of the reference frequency signal output from the voltage-controlled type TCXO 8.

Accordingly, in order to determine the reception frequency with a high accuracy, it is important that the output frequency of the voltage-controlled type TCXO 8 serving as a reference oscillator is constant. However, the output frequency of the voltage-controlled type TCXO 8 is slightly fluctuated depending on some factors such as a temperature.

For this reason, in the receiving circuit, the second intermediate frequency signal output from the second mixer 3 is supplied to a comparator 11. Then, the comparator 11 compares the second intermediate frequency signal with a reference signal (this reference signal has the same frequency as that of the second intermediate frequency signal) supplied thereto from a reference signal input terminal 12 to thereby detect a frequency difference.

A compared result based on the frequency difference detected by the comparator 11 is converted into a voltage signal by a charge pump circuit 13 and then averaged by a low-pass filter (LPF) 14. The voltage signal averaged by the LPF 14 is amplified by an amplifier 15 and supplied to the voltage-controlled type TCXO 8 as a control signal.

An error of an oscillation frequency of an oscillator can be corrected by controlling the oscillation frequency of the voltage-controlled type TCXO 8 as described above.

However, the above-mentioned frequency error correcting circuit is complicated in circuit arrangement.

In the circuit shown in FIG. 1, if a reference signal for comparison is prepared separately in order to enable the comparator 11 to detect the frequency of the intermediate frequency signal, there is then the risk that such reference signal will leak into the intermediate frequency circuit and impose a bad influence upon the intermediate frequency circuit.

Therefore, the frequency error correcting circuit should be designed with great care so as not to affect the intermediate frequency circuit.

Further, a comparator of an edge-detection type may be used as a phase comparator for composing the comparator 11.

When a phase difference signal output from the edge-detection type comparator is smoothed by the LPF 14, the characteristics of the charge pump circuit 13 should become severe upon mass-production.

Although the amplifier 15 is indispensable for increasing a control loop gain of the reference oscillator, it is unavoidable that such amplifier 15 increases a circuit scale.

Taking the aforesaid problems into consideration, it is difficult for the conventional frequency error correcting circuit to correct a frequency powerfully from a circuit scale standpoint. Accordingly, if the receiving circuit is not provided with the frequency error correcting circuit, then a highly-accurate reference oscillator whose oscillation frequency does not fluctuate with an outside influence of change in temperature or the like should be used as the reference oscillator 8.

While the problems the receiving circuit shown in FIG. 1 encountered are described so far, frequency error correcting circuits of other arrangements cannot avoid the aforementioned problems such as the complicated circuit arrangement.

SUMMARY OF THE INVENTION

In view of the aforesaid aspect, it is an object of the present invention to provide a receiving circuit in which a reference oscillator can be controlled by a simple circuit arrangement.

According to an aspect of the present invention, there is provided an oscillation circuit with feedback loop which is comprised of an oscillator for oscillating a predetermined frequency signal controlled by a predetermined signal, an exclusive-OR gate for detecting a phase of signal, a delay circuit for delaying a signal, and a processing circuit for converting a duty ratio signal to a predetermined signal for controlling the oscillator.

According to another aspect of the present invention, there is provided a receiving apparatus for receiving RF signal which is comprised of mixers for converting an RF signal to an IF signal by a signal from an oscillation circuit. The oscillation circuit comprises an oscillator for oscillating a predetermined frequency signal controlled by a predetermined signal, an exclusive-OR gate for detecting a phase of signal, a delay circuit for delaying a signal, and a processing circuit for converting a duty ratio signal to a predetermined signal for controlling said oscillator.

DETAILED DESCRIPTION OF THE PREFERRED EMBODIMENTS

Figure 1:
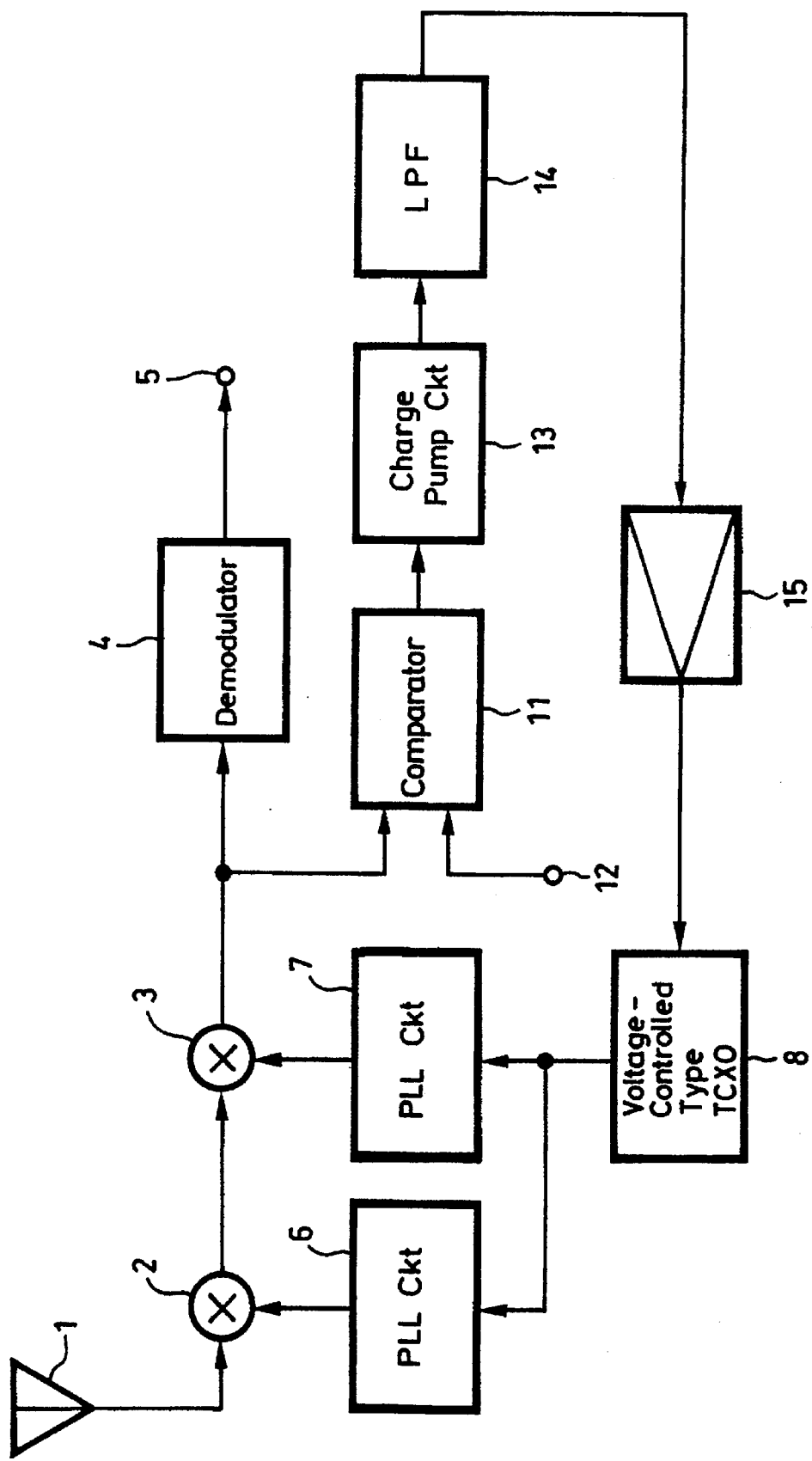
FIG. 1 is a block diagram showing an example of a receiving circuit.
Figure 2:
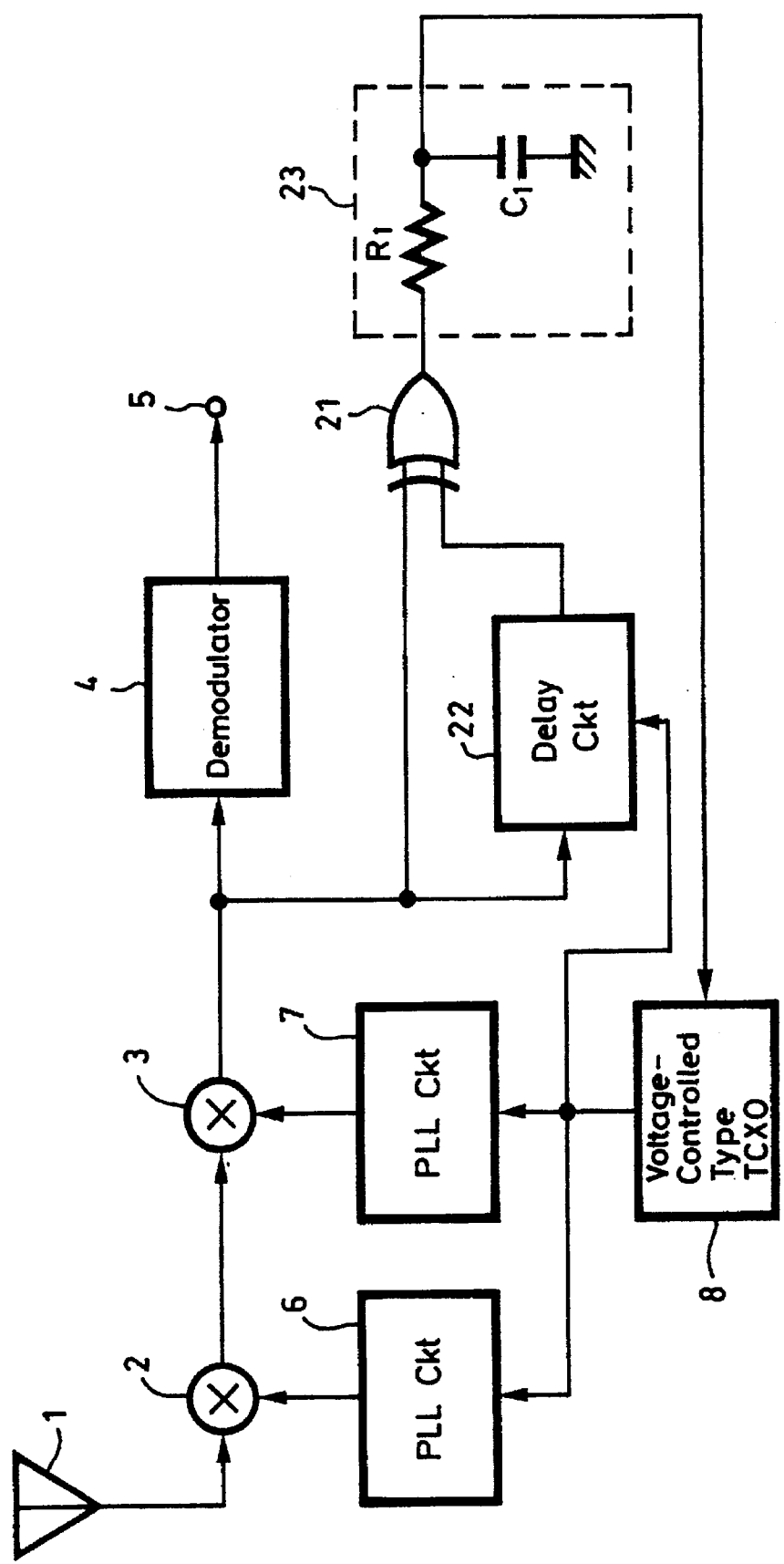
FIG. 2 is a block diagram showing a receiving circuit according to a first embodiment of the present invention.
Figure 3:
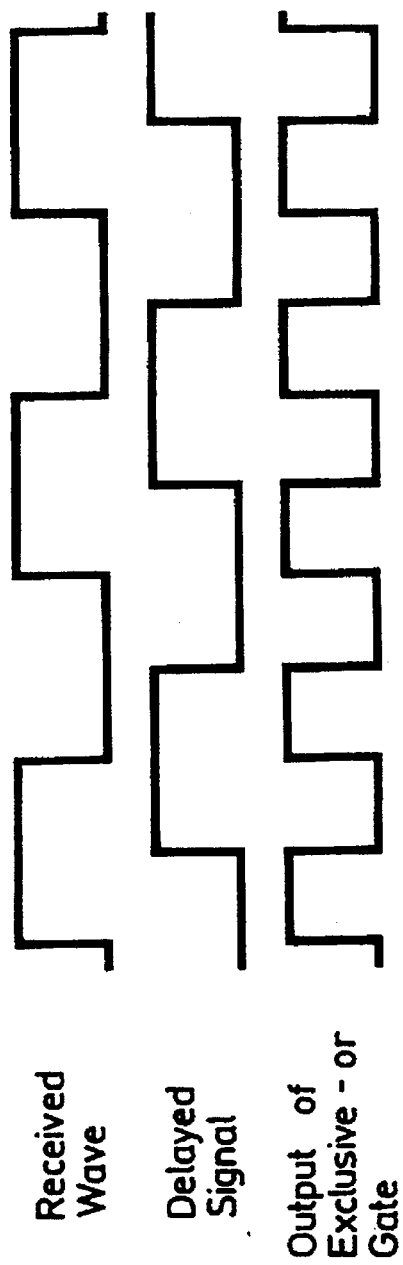
FIGS. 3A to 3C are timing charts showing a manner in which a control voltage is generated.

A receiving circuit according to a first embodiment of the present invention will now be described with reference to FIGS. 2 to 4. In FIG. 2, like parts corresponding to those of FIG. 1 are marked with the same references and therefore need not be described in detail.

FIG. 2 shows in block form a receiving circuit according to the present invention.

As shown in FIG. 2, the reception signal received at the antenna 1 is converted into the first intermediate frequency signal by the first mixer 2. Then, the first intermediate frequency signal is converted into the second intermediate frequency signal by the second mixer 3.

The second intermediate frequency signal is supplied to a delay detector composed of an exclusive-OR gate 21 and a delay circuit 22. Specifically, the second intermediate frequency signal is supplied to one input terminal of the exclusive-OR gate 21. Simultaneously, the second intermediate frequency signal is delayed by the delay circuit 22 by a predetermined delay time. Then, the signal delayed by the delay circuit 22 is supplied to the other input terminal of the exclusive-OR gate 21.

A clock signal output from the reference oscillator (voltage-controlled TCXO) 8 is supplied to the delay circuit 22. The delay circuit 22 delays the phase of the frequency of the second intermediate frequency signal by $\pi/2$ in synchronism with the clock signal supplied thereto. Then, the exclusive-OR gate 21 performs a logical calculation of exclusive-OR of the signal delayed by $\pi/2$ and the signal that is not delayed. An exclusive-OR output from the exclusive-OR gate 21 is supplied to a low-pass filter shown by a dotted line block 23.

The low-pass filter 23 is composed of a resistor R1 and a capacitor C1 and averages the output of the exclusive-OR gate 21. An output of the low-pass filter 23 is supplied to the voltage-controlled type TCXO 8 as a control voltage.

A rest of the arrangement is formed similarly to the receiving circuit shown in FIG. 1.

A frequency control operation of the receiving circuit according to the present invention will be described with reference to timing charts shown in FIGS. 3A to 3C.

Initially, let it be assumed that the second intermediate frequency signal output from the second mixer 3 has a waveform shown in FIG. 3A.

Assuming the frequency of the second intermediate frequency signal is accurate, then the delay circuit 22 outputs a signal (waveform is illustrated in FIG. 3B) whose phase is delayed by the delay time $\pi/2$ relative to the frequency of the second intermediate frequency signal.

The exclusive-OR gate 21 performs a logical calculation of exclusive-OR of both signals to provide a signal whose waveform is illustrated in FIG. 3C.

The output from the exclusive-OR gate 21 has a pulse waveform with a duty ratio of 50% when the frequency of the second intermediate frequency signal is a normal frequency. As the frequency of the second intermediate frequency signal is displaced from the normal frequency, the duty ratio of the waveform of the output from the exclusive-OR gate 21 is displaced from 50%.

Therefore, when the pulse waveform with a duty ratio of 50% is averaged by the low-pass filter 23, the voltage value of the output from the low-pass filter 23 becomes ($\frac{1}{2}$) Vdd relative to a maximum voltage value Vdd of the output of the low-pass filter 23.

When the voltage value ($\frac{1}{2}$) Vdd is supplied to the voltage-controlled type TCXO 8 as a control voltage, the frequency of the second intermediate frequency signal is an accurate normal frequency.

When the oscillation frequency of the voltage-controlled type TCXO 8 is not accurate, the frequency of the second intermediate frequency signal is displaced from the normal frequency. The duty ratio of the output signal from the exclusive-OR gate 21 increases or decreases with respect to 50% in response to a displacement of the frequency of the second intermediate frequency signal. Then, the frequency of the reference oscillation signal supplied to the first and second PLL circuits 6 and 7 is changed with the result that the oscillation frequency of the voltage-controlled type TCXO 8 is finally converged to an accurate value.

Figure 4:
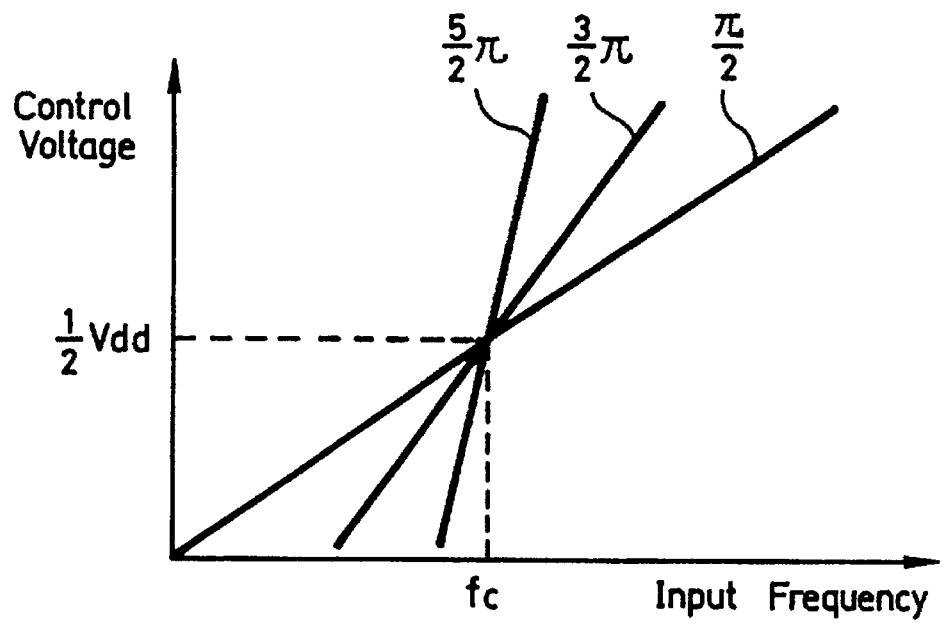
FIG. 4 is a characteristic graph showing a relationship between a delay time and a control voltage according to the present invention.

FIG. 4 shows a relationship between the control voltage of the voltage-controlled type TCXO 8 and the input frequency (i.e., frequency of second intermediate frequency).

As shown in FIG. 4, the characteristic shown by $\pi/2$ is a characteristic obtained when the phase delayed by the delay circuit 22 is selected to be $\pi/2$.

The characteristic shown by $(3/2)\pi$ in FIG. 4 is a characteristic obtained when the phase delayed by the delay circuit 22 is selected to be $(3/2)\pi$. The characteristic shown by $(5/2)\pi$ in FIG. 4 is a characteristic obtained when the phase delayed by the delay circuit 22 is selected to be $(5/2)\pi$. As can be understood from the above-mentioned characteristics, if the delay time is selected to be $(\pi/2) \times n$ (n is an odd integer), then when the control voltage is ($\frac{1}{2}$) Vdd, the frequency of the second intermediate frequency signal becomes a normal frequency fc.

Study of different inclinations of the respective delay time characteristic straight lines shown in FIG. 4 reveals that the ratio in which the control voltage changes relative to the change of the input frequency increases as the delay time increases from $\pi/2$ by $\pi$ each.

Therefore, if the delay time of the delay circuit 22 increases from $\pi/2$ by $\pi$ each, then a loop gain of the frequency correcting circuit can be increased. Thus, it is possible to obtain a satisfactory gain control loop by selecting $(\pi/2) \times n$ (n is an odd integer) to be a proper value.

As described above, according to the receiving circuit, a deviation of the frequency of the second intermediate frequency signal from the normal frequency can be detected by the detecting circuit composed of the delay gate circuit for delaying the intermediate frequency signal and the gate circuit for detecting a phase difference between the delayed signal and the signal, which is not delayed, by performing a logical calculation of exclusive-OR of both signals. Thus, the oscillation frequency of the voltage-controlled type TCXO 8 can be controlled with a high accuracy by the simple circuit arrangement.

As a result, the circuit scale of the receiving circuit can be reduced. Also, even when a reference oscillator with a relatively low oscillation accuracy is used, the reference oscillator can be oscillated at an accurate oscillation frequency.

Accordingly, a cost required by the circuit for obtaining a reference oscillation frequency can be reduced.

Figure 5:
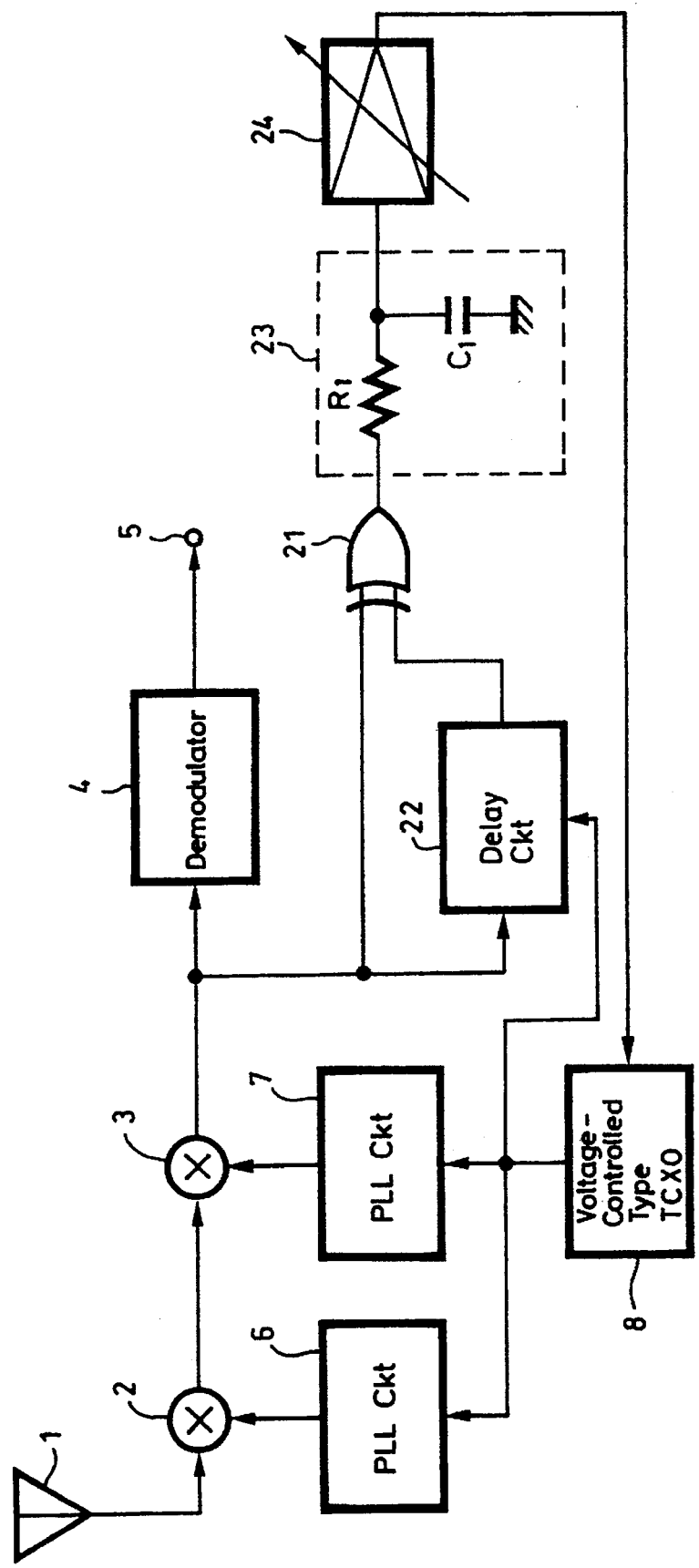
FIG. 5 is a block diagram showing a modified example of a receiving circuit according to the present invention.

FIG. 5 shows a modified example of a receiving circuit according to the present invention. In FIG. 5, like parts corresponding to those of FIG. 2 are marked with the same references and therefore need not be described in detail.

As shown in FIG. 5, the output from the exclusive-OR gate 21 composing the detecting circuit may be supplied through the low-pass filter 23 to a variable gain amplifier 24. It therefore becomes possible to adjust the gain of the control loop more finely by controlling the voltage-controlled type TCXO 8 with a signal whose gain is adjusted by the variable gain amplifier 24.

While the reference oscillator whose oscillation frequency is controlled by the analog voltage is used as described above, the present invention is not limited thereto and an oscillator whose oscillation frequency is controlled by digital data can be used.

Figure 6:
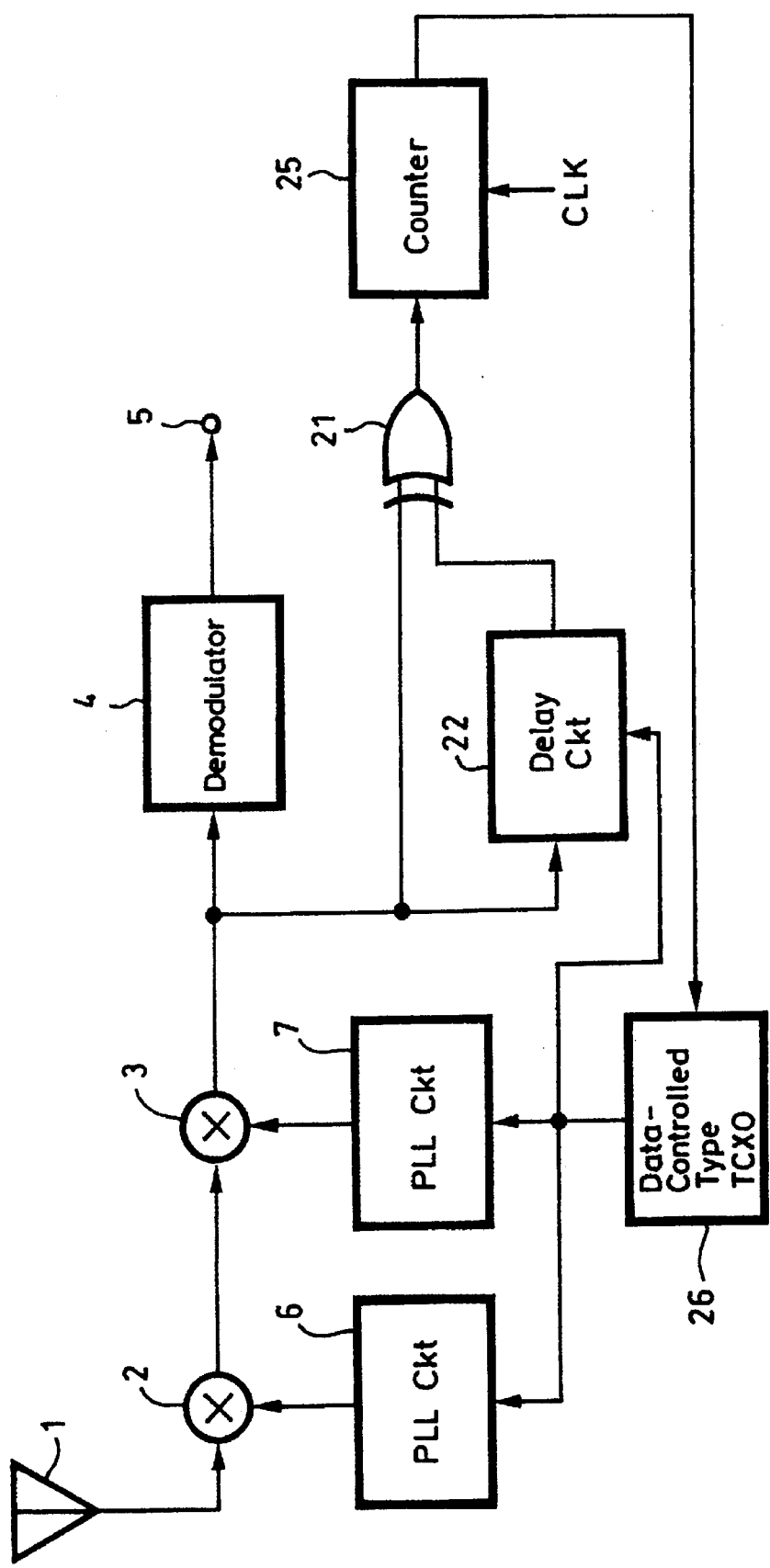
FIG. 6 is a block diagram showing a receiving circuit according to a second embodiment of the present invention.

FIG. 6 is a block diagram showing a receiving circuit using the oscillator whose oscillation frequency is controlled by digital data according to a second embodiment of the present invention. In this case, a data-controlled type TCXO 26, whose oscillation frequency is controlled by digital data, is used as a reference oscillator. In FIG. 6, like parts corresponding to those of FIG. 2 are marked with the same references and therefore need not be described in detail.

As shown in FIG. 6, the output from the exclusive-OR gate 21 is supplied to a counter 25 and the counter 25 detects a duty ratio of the output waveform of the exclusive-OR gate 21. Specifically, the counter 25 counts clocks of a predetermined number. If the output from the exclusive-OR gate 21 is used as a count enable signal of the counter 25, then a duty ratio can be detected. Count data of the counter 25 is supplied to a data-controlled type TCXO 26.

The rest of the arrangement is similar to that of the receiving circuit as shown in FIG. 2.

With the above-mentioned arrangement, since the oscillation frequency of the TCXO 26 can be directly controlled by the duty ratio of the output waveform of the exclusive-OR gate 21, the oscillation frequency can be set to the normal frequency by digitally controlling the oscillation frequency. Therefore, as compared with the case where the analog-system circuit is used, the oscillator can be prevented from being affected by a fluctuation characteristic: such as a change in temperature of the analog-system circuit.

Further, an arbitrary gain can be easily obtained by properly using the control data. Moreover, the circuit scale of the receiving circuit can be reduced and the gain can be adjusted freely.

Furthermore, a digital duty ratio detecting means can be used while the voltage-controlled type TCXO is used as the reference oscillator.

Figure 7:
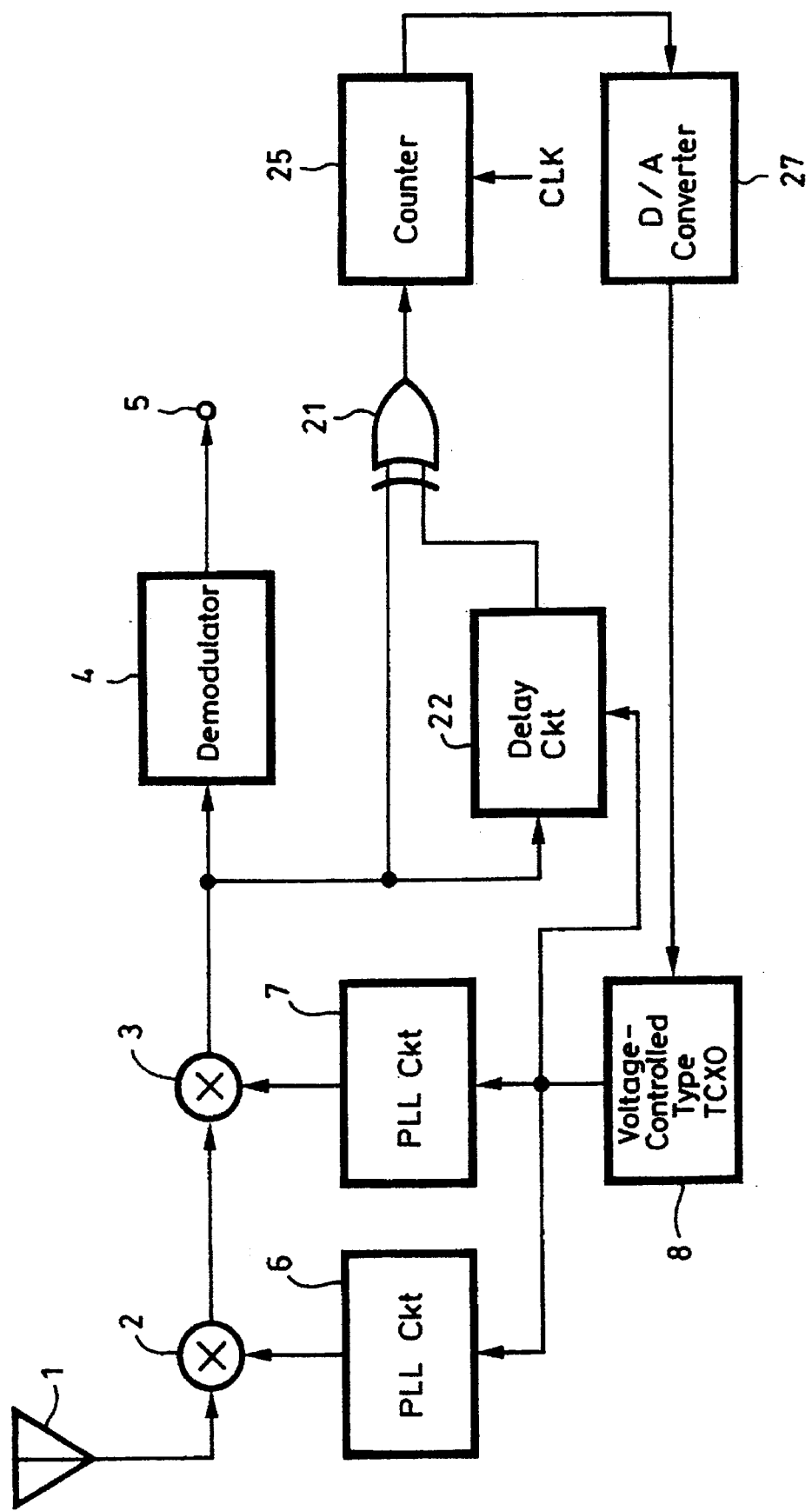
FIG. 7 is a block diagram showing a receiving circuit according to a third embodiment of the present invention.

FIG. 7 shows in block form an arrangement of such a receiving circuit wherein the voltage-controlled type TCXO 8 whose oscillation frequency is controlled by an analog voltage is used as a reference oscillator. In FIG. 7, like parts corresponding to those of FIG. 6 are marked with the same references and therefore need not be described in detail.

As shown in FIG. 7, the output from the exclusive-OR gate 21 is supplied to the counter 25. Then, a counted result from the counter 25 is converted by a digital-to-analog (D/A) converter 27 and supplied to the voltage-controlled type TCXO 8.

The rest of the arrangement is similar to that of FIG. 2.

A satisfactory gain control loop can be easily realized by controlling output data of the counter, if necessary, similar to the second embodiment shown in FIG. 6. According to the third embodiment shown in FIG. 7, it is possible to achieve advantages similar to those of the first and second embodiments.

While the present invention is applied to the circuit in which the received signal is converted into the first intermediate frequency signal and further converted into the second intermediate frequency signal as described above, a principle of the present invention can also be applied to a receiving circuit which uses an intermediate frequency signal with a single frequency.

While a demodulating system for demodulating a received signal is not described in the first, second and third embodiments, a principle of the present invention can be applied to a receiving circuit which uses any demodulation system.

According to the present invention, the phase difference between the intermediate frequency signals can be detected by the detecting means composed of the delay means for delaying the intermediate frequency signal and the means for phase-comparing the signal delayed by the delay means and the signal which is not delayed. The oscillation frequency of the reference oscillator can be satisfactorily detected based on the detected phase difference.

Therefore, the RF signal can be accurately received by the receiving circuit of the simple arrangement. Even when the oscillator with a relatively low oscillation accuracy is used as the reference oscillator, the accurate oscillation frequency can be obtained by the simple circuit arrangement.

The voltage-controlled type TCXO 8 is used as the reference signal generating means and the phase difference signal is averaged and supplied to the reference signal generating means, whereby the oscillation frequency of the reference oscillator can be satisfactorily controlled by use of the analog voltage.

The data-controlled type TCXO 26 is used as the reference signal generating means and the phase difference signal is detected as the duty ratio data. Then, the detected duty ratio data is supplied to the data-controlled type TCXO 26. Therefore, the oscillation frequency of the reference oscillator can be satisfactorily controlled by use of digital data.

Furthermore, the voltage-controlled type TCXO 8 is used as the reference signal generating means and the phase difference signal is detected as the duty ratio data. Then, the detected duty ratio data is supplied through the D/A converter to the voltage-controlled type TCXO 8. Therefore, the oscillation frequency of the reference oscillator can be controlled by use of the analog voltage and the digital data.

Having described preferred embodiments of the invention with reference to the accompanying drawings, it is to be understood that the invention is not limited to those precise embodiments and that various changes and modifications could be effected therein by one skilled in the art without departing from the scope of the invention as defined in the appended claims.

What is claimed is:

1. An oscillation circuit with a feedback loop comprising:
    oscillation means for producing a predetermined frequency output signal and being controlled by a control signal;
    mixer means for mixing said output signal from said oscillation means with a received signal and reproducing an intermediate frequency signal;

exclusive-OR means for receiving at one input the intermediate signal from said mixer means;

delay means for delaying the signal from said mixer means and feeding the delayed signal to another input of said exclusive-OR means, whereby said exclusive-OR means detects a phase of said intermediate signal; and processing means for converting a duty ratio signal output from said exclusive-OR means to said control signal for controlling said oscillation means, wherein said processing means produces a digital data signal for controlling said oscillation means.

2. An oscillation circuit with feedback loop as claimed in claim 1, wherein said processing means is a counter circuit.

3. A receiving apparatus for receiving an RF signal having a mixer for converting an RF signal to an IF signal by mixing with a signal from an oscillation circuit, said oscillation circuit comprising:

oscillation means for producing a predetermined frequency signal and being controlled by a control signal;

exclusive-OR means for receiving at one input the IF signal from said mixer;

delay means for delaying the IF signal from said mixer and feeding the delayed signal to another input of said exclusive-OR means, whereby said exclusive-OR means detects a phase of said IF signal; and processing means for converting a duty ratio signal output from said exclusive-OR means to said control signal for controlling said oscillation means, wherein said processing means produces said control signal as a digital data signal for controlling said oscillation means.

4. A receiving apparatus for receiving an RF signal as claimed in claim 3, wherein said processing means comprises a counter circuit enabled by the duty ratio signal from said exclusive-OR means for counting clock pulses fed thereto.

5. A receiving apparatus for receiving an RF signal as claimed in claim 3, wherein said processing means comprises a counter circuit and digital-to-analog converter for producing said control signal as an analog voltage.

6. A receiving apparatus for receiving an RF signal as claimed in claim 3, wherein said delay means has a delay time corresponding to $(\pi/2)*n$, where n is an odd number.

* * * * *